United States Patent
Ohazama (10) Patent No.: US 9,705,105 B2
(45) Date of Patent: Jul. 11, 2017

(54) CONNECTION STRUCTURE FOR ELECTRICAL COMPONENT

(71) Applicants: PIONEER CORPORATION, Kawasaki-shi, Kanagawa (JP); TOHOKU PIONEER CORPORATION, Tendo-shi, Yamagata (JP)

(72) Inventor: Hidetaka Ohazama, Yonezawa (JP)

(73) Assignees: PIONEER CORPORATION, Kawasaki-Shi, Kanagawa (JP); TOHOKU PIONEER CORPORATION, Tendo-Shi, Yamagata (JP)

( * ) Notice: Subject to any disclaimer, the term of this patent is extended or adjusted under 35 U.S.C. 154(b) by 0 days.

(21) Appl. No.: 14/781,556

(22) PCT Filed: Apr. 1, 2013

(86) PCT No.: PCT/JP2013/059835
§ 371 (c)(1),
(2) Date: Sep. 30, 2015

(87) PCT Pub. No.: WO2014/162394
PCT Pub. Date: Oct. 9, 2014

(65) Prior Publication Data
US 2016/0056405 A1    Feb. 25, 2016

(51) Int. Cl.
*H01L 23/04* (2006.01)
*H01L 51/52* (2006.01)
*H01L 27/32* (2006.01)

(52) U.S. Cl.
CPC ...... *H01L 51/5203* (2013.01); *H01L 27/3288* (2013.01); *H01L 51/5253* (2013.01); *H01L 2251/5369* (2013.01)

(58) Field of Classification Search
USPC ......... 257/E23.169, E23.175, 730, 773, 786, 257/795
See application file for complete search history.

(56) References Cited

U.S. PATENT DOCUMENTS 7,327,042 B2 *   2/2008   Ohazama ............... H05K 3/323
                                                             257/730
2004/0108132 A1   6/2004   Ohazama

FOREIGN PATENT DOCUMENTS

JP          07-197001         8/1995
JP          2000-251536   *   9/2000
(Continued)

OTHER PUBLICATIONS

International Search Report for PCT/JP2013/059835 dated May 21, 2013.

*Primary Examiner* — Telly Green
(74) *Attorney, Agent, or Firm* — Procopio, Cory, Hargreaves & Savitch LLP (57) ABSTRACT

An electrical component (40) and a substrate (100) constitute at least a portion of an electrical device. At least one surface of the substrate (100) is formed of an insulator. A conductor (20) is formed on the one surface. The conductor (20) is covered with a sealing film (210). The sealing film (210) is a film having insulation properties. An opening (212) is formed in the sealing film (210). The opening (212) is located on a portion of the conductor (20) when seen in a plan view. The conductor (20) is connected to the electrical component (40) with an anisotropic conductive film (30) interposed therebetween. The anisotropic conductive film (30) overlaps the opening (212), and contains a plurality of metal particles.

21 Claims, 9 Drawing Sheets

(56) References Cited

FOREIGN PATENT DOCUMENTS

| JP | 2003-347042 | 12/2003 |
| JP | 2004-184805 | 7/2004 |
| JP | 2009-110790 | 5/2009 |
| JP | 2009-288540 | * 12/2009 |

* cited by examiner

CONNECTION STRUCTURE FOR ELECTRICAL COMPONENT

TECHNICAL FIELD

The present invention relates to a connection structure for an electrical component.

BACKGROUND ART

There is an organic electroluminescence (EL) element as one of light sources for an illumination device or a display. The organic EL element is vulnerable to moisture, and thus is required to be sealed. In a sealing structure of the organic EL element, a sealing film may be used, for example, as disclosed in Patent Document 1. In Patent Document 1, alumina formed by an atomic layer deposition method is used as the sealing film.

RELATED DOCUMENT

Patent Document

[Patent Document 1] Japanese Unexamined Patent Application Publication No. 2003-347042

SUMMARY OF THE INVENTION

In order to bring an electrical device into operation, a plurality of electrical components are required to be connected to each other through a conductor. However, when the conductor is covered with a sealing film, it is difficult to electrically connect the conductor to the electrical components.

The invention that solves this problem includes an example in which, when a conductor located on a substrate is covered with a covering body, the conductor can be electrically connected to an electrical component.

According to the invention of claim 1, there is provided a connection structure for an electrical component including: a substrate having a conductor and a covering body of the conductor; an electrical component; and an anisotropic conductive film having first particles and second particles, wherein the first conductive particle is harder than the second conductive particle, and the anisotropic conductive film connects the conductor and the electrical component.

BRIEF DESCRIPTION OF THE DRAWINGS

The above-mentioned objects, other objects, features and advantages will be made clearer from the preferred embodiment described below, and the following accompanying drawings.

DESCRIPTION OF EMBODIMENTS

Hereinafter, an embodiment of the present invention will be described with reference to the accompanying drawings. In all the drawings, like elements are referenced by like reference numerals and the descriptions thereof will not be repeated.

FIG. 1(a) is a cross-sectional view illustrating a connection structure for an electrical component 40 according to an embodiment. The electrical component 40 and a substrate 100 constitute at least a portion of an electrical device. At least one surface of the substrate 100 is formed of an insulator. A conductor 20 is formed on the one surface. The conductor 20 is covered with a sealing film 210 (covering body). The sealing film 210 is a film having insulation properties. An opening 212 is formed in the sealing film 210. The opening 212 is located above a portion (for example, one end) of the conductor 20 when seen in a plan view. The conductor 20 is connected to the electrical component 40 with an anisotropic conductive film 30 interposed therebetween. The anisotropic conductive film 30 overlaps the opening 212, and has, for example, a plurality of metal particles 32 (described later with reference to FIG. 1(b)) as first conductive particles.

Meanwhile, the sealing film 210 includes a film formed of an oxide, for example, at least a film formed of an aluminum oxide. The sealing film 210 may have a single-layered structure, and may have a structure in which a plurality of metal oxide films are laminated.

FIG. 1(b) is an enlarged view of the periphery of the opening 212 in FIG. 1(a). As described above, the anisotropic conductive film 30 has the metal particles 32. When seen in the width direction of the opening 212, at least a portion of at least one metal particle 32 is located within the opening 212. In addition, at least a portion of at least one metal particle 32 is located within the opening 212. When seen in a plan view, a portion of the metal particle 32 protrudes from the opening 212. In other words, the width of the opening 212 is smaller than the circle-equivalent diameter of the metal particle 32. In addition, the height of the metal particle 32 that comes into contact with the conductor 20 is larger than the thickness of the sealing film 210. In the shown example, the conductive particle is a spherical body, but may have shapes other than a spherical body, for example, shapes the cross-section of which is polygonal such as quadrangular, ellipsoidal, or the like, without being limited thereto.

In addition, the anisotropic conductive film 30 has, for example, resin particles 34 as second conductive particles, in addition to the metal particles 32. As described above, the metal particle 32 is a particle which is formed of a metal material in its entirety. A variation in the diameter of the second conductive particles is smaller than a variation in the diameter of the first conductive particles. The resin particle 34 is configured such that its core is formed of a resin material, and that a conductive layer (for example, metal layer) is included on the surface of the core. In addition, the resin particles 34 come into contact with the metal particles 32 in the conductor 20. In addition, the resin particles 34 are electrically connected to the electrical component 40. Since the metal particles 32 that come into contact with the conductor 20 are in contact with the resin particles 34 that are electrically connected to the electrical component 40, the conductor 20 and the electrical component 40 are electrically connected to each other.

The first conductive particle is harder than the second conductive particle. For example, in the aforementioned example, since the metal particle 32 which is the first conductive particle is formed of a metal material, and the resin particle 34 which the second conductive particle is formed of a resin material, the first conductive particle is harder than the second conductive particle. In addition, without being limited to the aforementioned example, the first conductive particle is formed of an inorganic material, and thus may be made to be harder than the second conductive particle. In addition, the first conductive particle may be formed of a hard resin material, and the second conductive particle may be formed of a soft resin material. A hard resin material includes a polycarbonate-based resin, an ABS resin or the like, and a soft resin material includes a polyurethane-based resin or the like.

More specifically, the anisotropic conductive film 30 includes a first layer 302 and a second layer 304. The first layer 302 faces a conductor 20, and the second layer 304 faces the electrical component 40. The first layer 302 is formed of an anisotropic conductive resin obtained by injecting a plurality of metal particles 32 into an insulating resin material, and the second layer 304 is formed of an anisotropic conductive resin obtained by injecting a plurality of resin particles 34 into an insulating resin material. Meanwhile, some metal particles 32 may enter the second layer 304, and some resin particles 34 may enter the first layer 302. Even in this case, the content rate of the metal particles 32 in the first layer 302 is higher than the content rate of the metal particles 32 in the second layer 304. In addition, the content rate of the resin particles 34 in the second layer 304 is higher than the content rate of the resin particles 34 in the first layer 302. Meanwhile, the content rate of particles can be defined as, for example, an area occupying ratio in a cross-section.

FIG. 1(c) is a diagram illustrating a modification example of FIG. 1(b). In an example shown in FIG. 1(b), some metal particles 32 are connected to the sealing film 210 by being embedded in the sealing film 210. The opening 212 is formed by the metal particles 32 being embedded in the sealing film 210. On the other hand, in an example shown in FIG. 1(c), some metal particles 32 are connected to the conductor 20 by being fitted into the opening 212 which has been already formed.

Meanwhile, in the examples shown in FIGS. 1(b) and 1(c), the anisotropic conductive film 30 is formed by two layers of the first layer 302 and the second layer 304, but another layer having a conductive property may be present between the first layer 302 and the second layer 304 in at least a thickness direction. The other layer may include the aforementioned conductive particles. In addition, in any of the cases, at least a portion of at least one first conductive particle of a plurality of first conductive particles included in the anisotropic conductive film 30 is located within the opening 212.

In addition, in the examples shown in FIGS. 1(b) and 1(c), an interface is present between the first layer 302 and the second layer 304. However, in reality, the interface between the first layer 302 and the second layer 304 may not be likely to be clearly determined. In such a case, when in the thickness direction of the anisotropic conductive film 30, a portion of the anisotropic conductive film 30 from a surface facing the conductor 20 to a height equivalent to ⅓ the thickness of the anisotropic conductive film 30 is defined as the lower portion of the anisotropic conductive film 30, and a portion of the anisotropic conductive film 30 from a surface facing the electrical component 40 to a height equivalent to one-third of the thickness of the anisotropic conductive film 30 is defined as the upper portion of the anisotropic conductive film 30, it can be said that the both are the same as each other. That is, the content rate of the metal particles 32 in the lower portion of the anisotropic conductive film 30 is higher than the content rate of the metal particles 32 in the upper portion thereof. In addition, the content rate of the resin particles 34 in the upper portion of the anisotropic conductive film 30 is higher than the content rate of the resin particles 34 in the lower portion thereof.

In addition, the aforementioned anisotropic conductive film is not limited to including the first layer 302 and the second layer 304, and may be configured such that the content rate of the metal particles 32 gradually increases from the upper portion of the anisotropic conductive film to the lower portion thereof, and that the content rate of the resin particles 34 gradually increases from the lower portion of the anisotropic conductive film to the upper portion thereof. Meanwhile, in this increasing process, the content rate may change in a stepwise manner.

Figure 1:
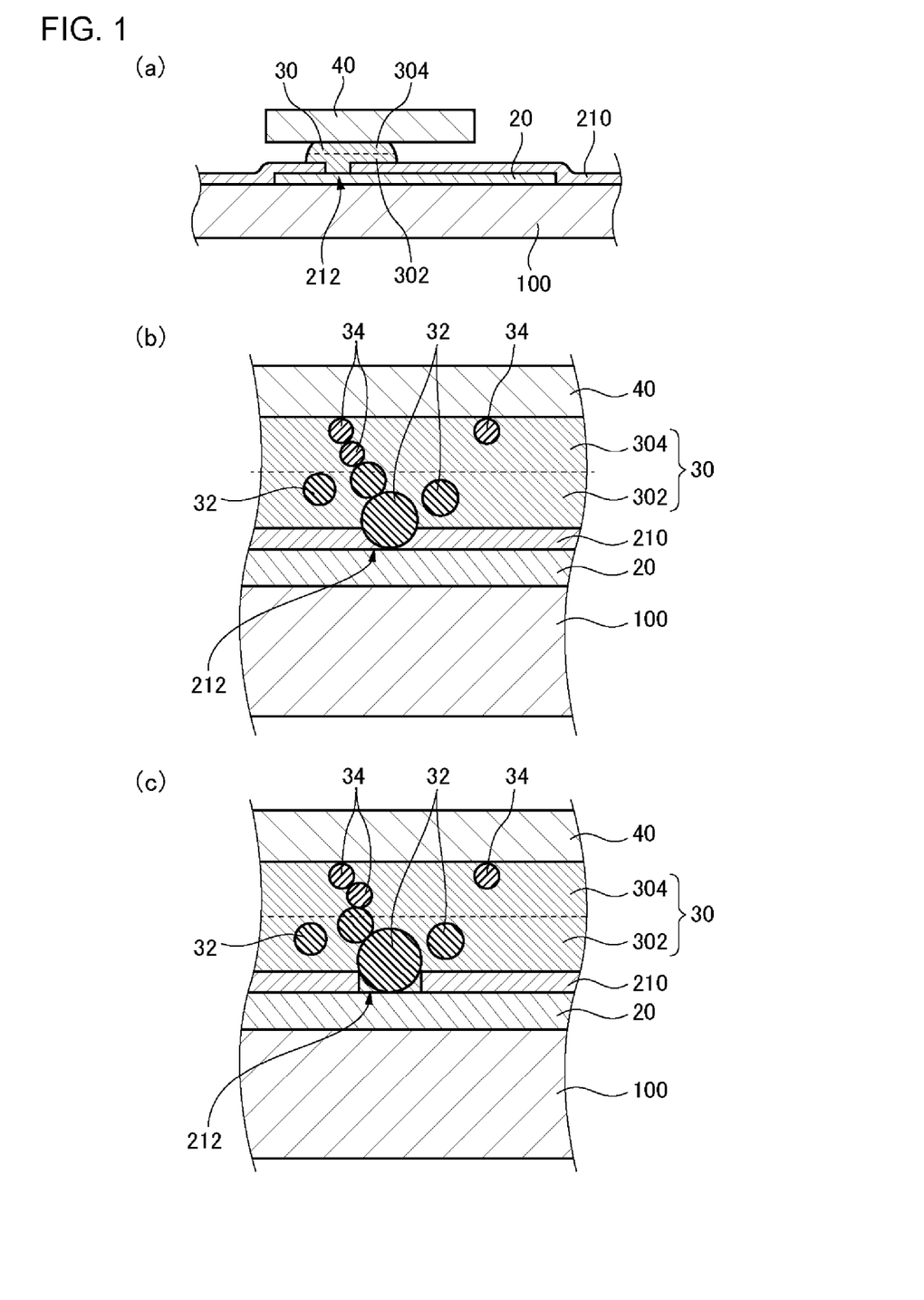
FIG. 1(a) is a cross-sectional view illustrating a connection structure for an electrical component according to an embodiment.
FIGS. 1(b) and 1(c) are enlarged views of the periphery of an opening in FIG. 1(a).
Figure 2:
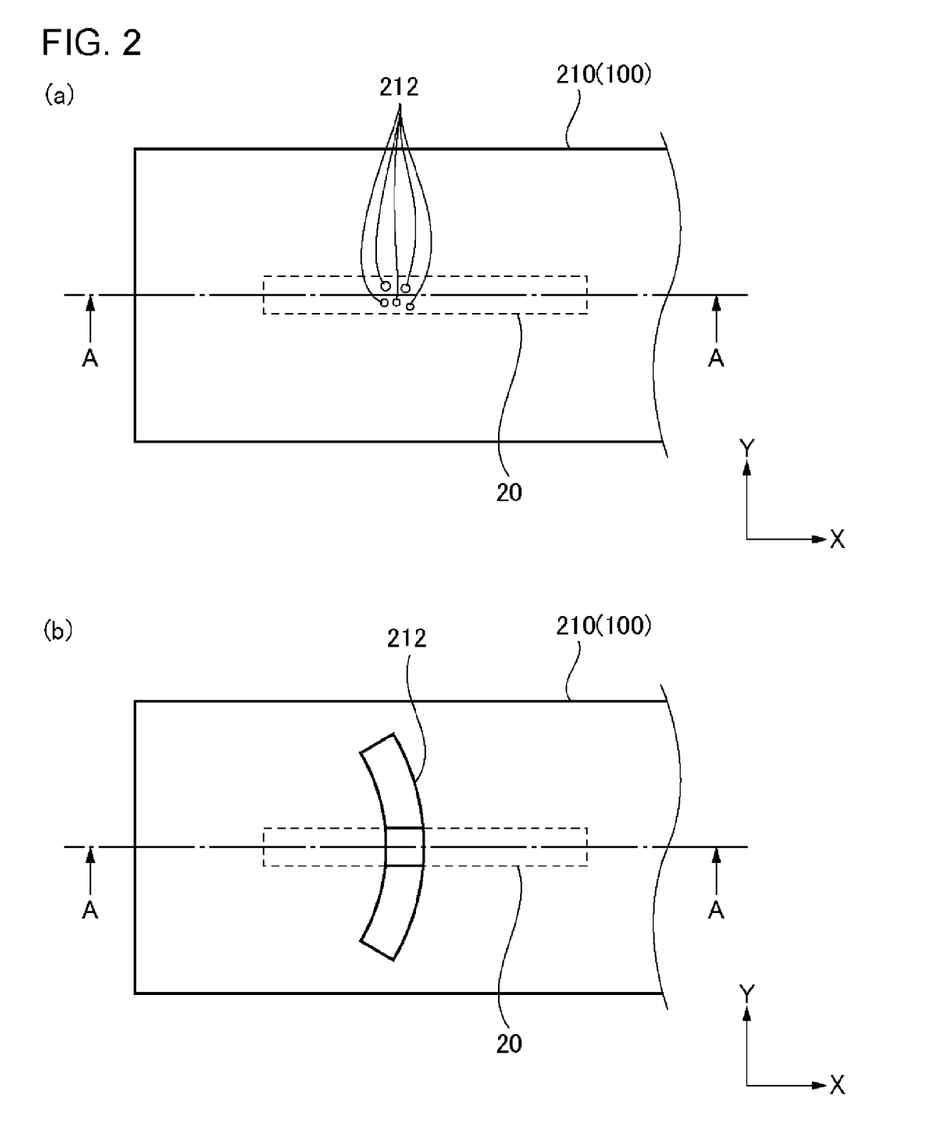
FIGS. 2(a) and 2(b) are plan views illustrating a substrate.

Both FIGS. 2(a) and 2(b) are plan views illustrating the substrate 100, and FIG. 1(a) corresponds to a cross-section taken along line A-A of FIG. 2. In these drawings, the conductor 20 extends in a specific direction.

FIG. 2(a) corresponds to FIG. 1(b), and the opening 212 is formed by a plurality of metal particles 32 sinking into the sealing film 210.

FIG. 2(b) corresponds to FIG. 1(c). Specifically, the opening 212 extends in a direction intersecting the extending direction of the conductor 20. That is, when seen in a plan view, the opening 212 traverses the conductor 20. In addition, when seen in a plan view, the opening 212 may be formed from the inside of the conductor 20 across to the outside thereof. The opening 212 has, for example, a shape along a portion of a circular arc.

Meanwhile, it is preferable that the entire opening 212 is covered with the anisotropic conductive film 30. However, the end of the opening 212 may be exposed from the anisotropic conductive film 30.

A structure shown in FIG. 1(b) and FIG. 2(a) is formed by, for example, the following method. First, the substrate 100 having the conductor 20 and the sealing film 210 formed thereon and the electrical component 40 are prepared. In this state, the opening 212 is not formed in the sealing film 210. Next, the anisotropic conductive film 30 is interposed between the substrate 100 and the electrical component 40. For example, after the anisotropic conductive film 30 is disposed on the substrate 100, the electrical component 40 may be disposed on the anisotropic conductive film 30, and the electrical component 40 may be disposed on the substrate 100 in a state where the anisotropic conductive film 30 is installed onto a surface (that is, surface having a connection terminal) of the electrical component 40 which faces the substrate 100 side.

Next, the electrical component 40 is pressed toward the substrate 100 using a holding tool. The pressing causes the metal particles 32 in the anisotropic conductive film 30 to push, break, or pass through the sealing film 210, and to come into contact with the conductor 20. At this time, the opening 212 is formed in the sealing film 20. The conductor 20 and the electrical component 40 allow electrical conduction to each other through at least the metal particles 32 by which the opening 212 is formed and the resin particles 34.

Figure 3:
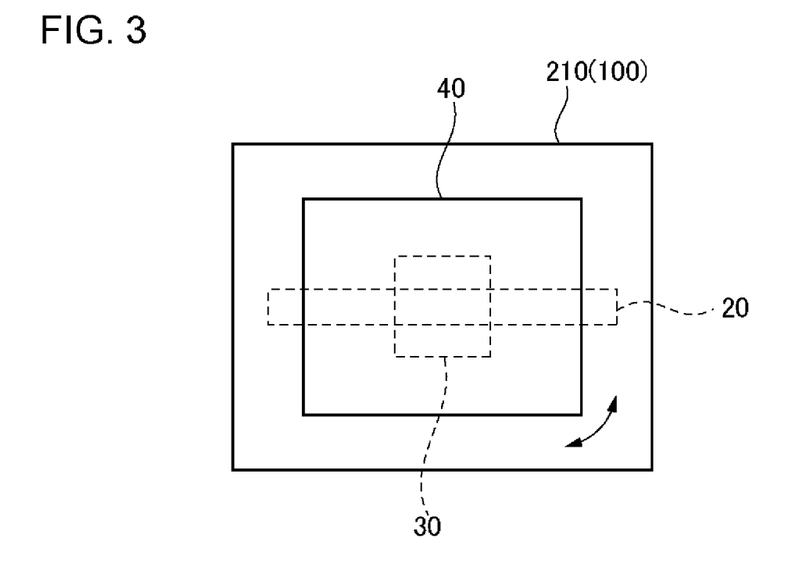
FIG. 3 is a diagram illustrating a method of forming a connection structure for an electrical component shown in FIGS. 1 and 2.

FIG. 3 is a diagram illustrating a method of forming a connection structure for the electrical component 40 shown in FIG. 1 (c) and FIG. 2(a). This connection structure is formed as follows. First, the anisotropic conductive film 30 is interposed between the substrate 100 and the electrical component 40. For example, after the anisotropic conductive film 30 is disposed on the substrate 100, the electrical component 40 may be disposed on the anisotropic conductive film 30, or the electrical component 40 may be disposed on the substrate 100 in a state where the anisotropic conductive film 30 is installed onto a surface (that is, surface having a connection terminal) of the electrical component 40 that faces the substrate 100 side. Next, while the electrical component 40 is pressed toward the substrate 100 using a holding tool, this holding tool is moved in a plane direction, and thus the electrical component 40 is moved in the plane direction. Thereby, the metal particles 32 move in a state of being pressed against the sealing film 210, and as a result, the opening 212 is formed in the sealing film 210. When seen in a plan view, the opening 212 is formed in a state of traversing the conductor 20, or a state of crossing from the inside of the conductor 20 to the outside thereof. The conductor 20 and the electrical component 40 allow electrical conduction to each other through at least the metal particles 32 by which the opening 212 is formed and the resin particles 34. In the example shown in the drawing, since the holding tool rotationally moves the electrical component 40, the opening 212 becomes a portion of a circular arc.

As described above, according to the present embodiment, the conductor 20 is covered with the sealing film 210. The conductor 20 is connected to the electrical component 40 through the anisotropic conductive film 30, within the opening 212 provided in the sealing film 210. Therefore, even when the conductor 20 is covered with the sealing film 210, the conductor 20 can be connected to the electrical component 40.

In addition, the opening 212 of the sealing film 210 is formed using the metal particles 32 included in the anisotropic conductive film 30. As a result, the opening 212 is formed in a state of traversing the conductor 20 or a state of crossing from the inside of the conductor 20 to the outside thereof. The conductor 20 is connected to the electrical component 40 through the metal particles 32 by which the opening 212 is formed. Therefore, it is possible to easily form the opening 212 on the conductor 20, and to easily connect the conductor 20 within the opening 212 to the electrical component 40. Meanwhile, since the hardness of the resin particle 34 is lower than that of the metal particles 32, there is the possibility of the opening 212 not being able to be formed when the metal particles 32 are not contained in the anisotropic conductive film 30.

In addition, the resin particles 34 are contained in the anisotropic conductive film 30. A variation in the diameter of the resin particles 34 is smaller than a variation in the diameter of the metal particles 32. For this reason, it is possible to more reliably connect the conductor 20 to the electrical component 40.

Particularly, in the present embodiment, the anisotropic conductive film 30 is formed by the first layer 302 and the second layer 304. The first layer 302 faces the conductor 20. For this reason, the opening 212 can be formed by the metal particles 32 in the first layer 302.

In addition, when the conductor 20 is connected to an element, such as an organic EL element, which is vulnerable to moisture, providing the opening 212 gives rise to the possibility of moisture being transmitted to this element along the conductor 20. On the other hand, in the present embodiment, one end 32 of the wire 30 covers the opening 212. Therefore, even when the opening 212 is provided in the sealing film 210, it is possible to suppress a decrease in the sealability of the sealing film 210.

Meanwhile, in the aforementioned embodiment, when the conductor 20 is formed of Al, the sealing film 210 may be an oxide film (for example, natural oxide film) of a film or the like formed of an aluminum oxide which is formed on the surface of the conductor 20. In this case, the opening 212 is formed in the oxide film.

EXAMPLE

Example 1

Figure 4:
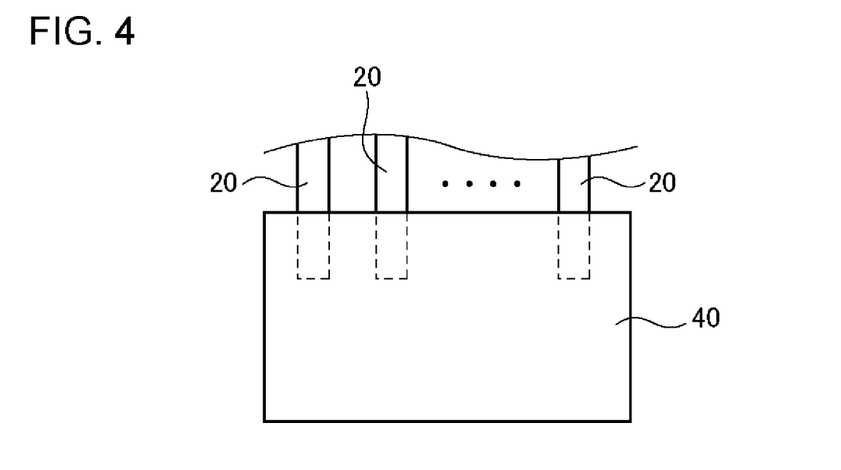
FIG. 4 is a plan view illustrating a connection structure for an electrical component according to Example 1.

FIG. 4 is a plan view illustrating a connection structure for the electrical component 40 according to Example 1. In the present example, the electrical component 40 includes a plurality of terminals. The substrate 100 also includes a plurality of conductors 20. The plurality of terminals included in the electrical component 40 are connected to the conductors 20 different from each other, respectively.

The plurality of conductors 20 are aligned along the edge of the substrate 100. The openings 212 (not shown in the drawing) are also aligned along the edge of the substrate 100.

Figure 5:
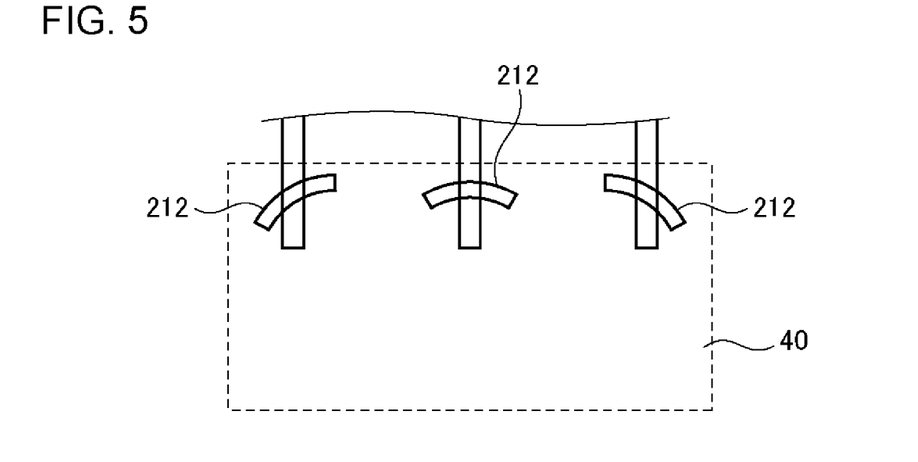
FIG. 5 is a diagram illustrating planar shapes of openings.

FIG. 5 is a diagram illustrating planar shapes of the openings 212. As described above, the openings 212 are aligned along the edge (one side) of a light-emitting device 10. Two openings 212 located on both ends of this alignment are different from each other in the direction of a circular arc. Specifically, both of two circular arcs plotted by the two openings 212 are configured such that the inner sides thereof are directed to the center of the substrate 100. This is because, as described in the embodiment, the openings 212 are formed by rotationally moving the electrical component 40 while the metal particles 32 included in the anisotropic conductive film 30 are press against the sealing film 210 using the electrical component 40.

In the present example, for the same reason as that in the embodiment, it is also possible to easily form the opening 212 on the conductor 20, and to easily connect the conductor 20 within the opening 212 to the electrical component 40. In addition, the resin particles 34 are contained in the anisotropic conductive film 30 in addition to the metal particles 32. A variation in the diameter of the resin particles 34 is smaller than a variation in the diameter of the metal particles 32. Therefore, it is possible to more reliably connect the conductor 20 to the electrical component 40.

Example 2

Figure 6:
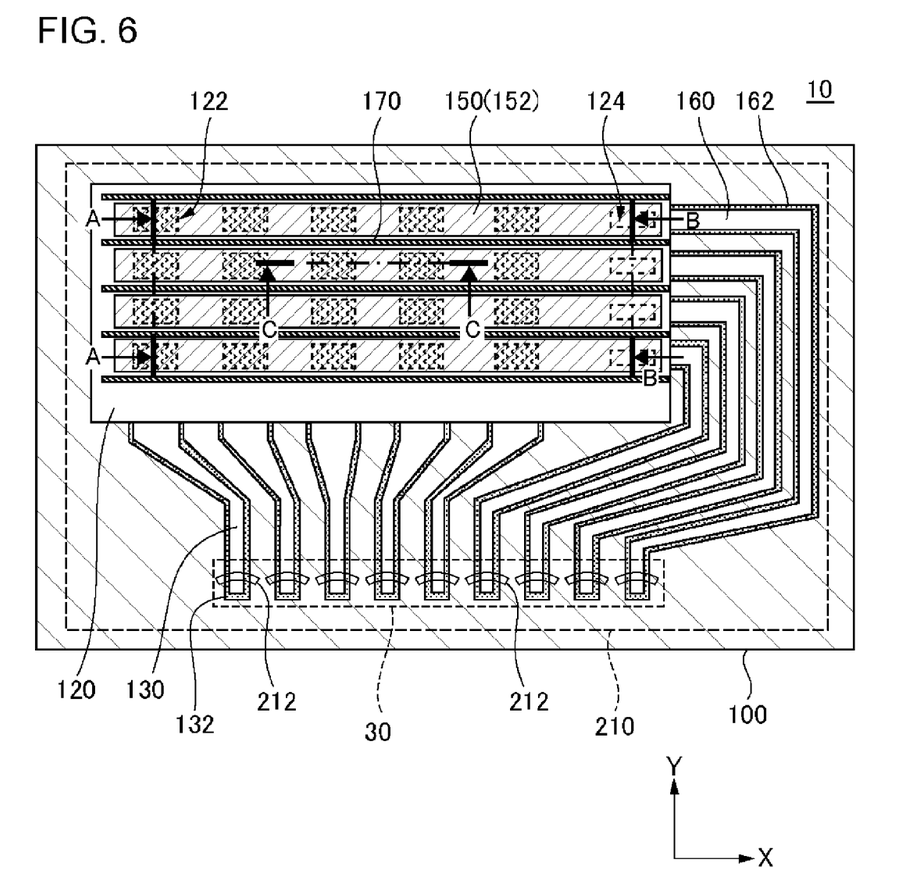
FIG. 6 is a plan view illustrating a configuration of a light-emitting device 10 included in an electrical device according to an example.
Figure 7:
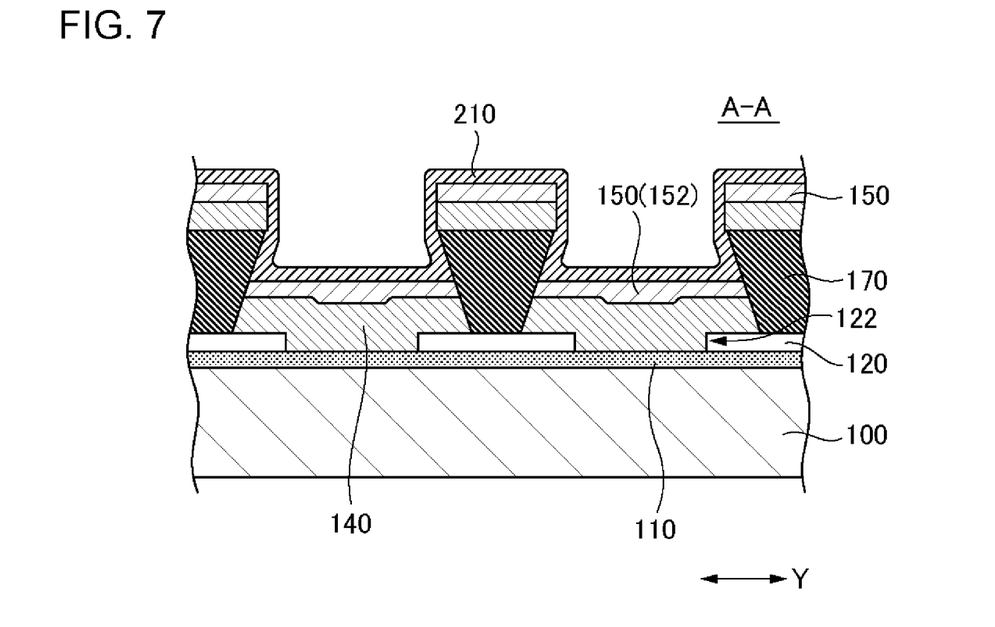
FIG. 7 is a cross-sectional view taken along line A-A of FIG. 6.
Figure 8:
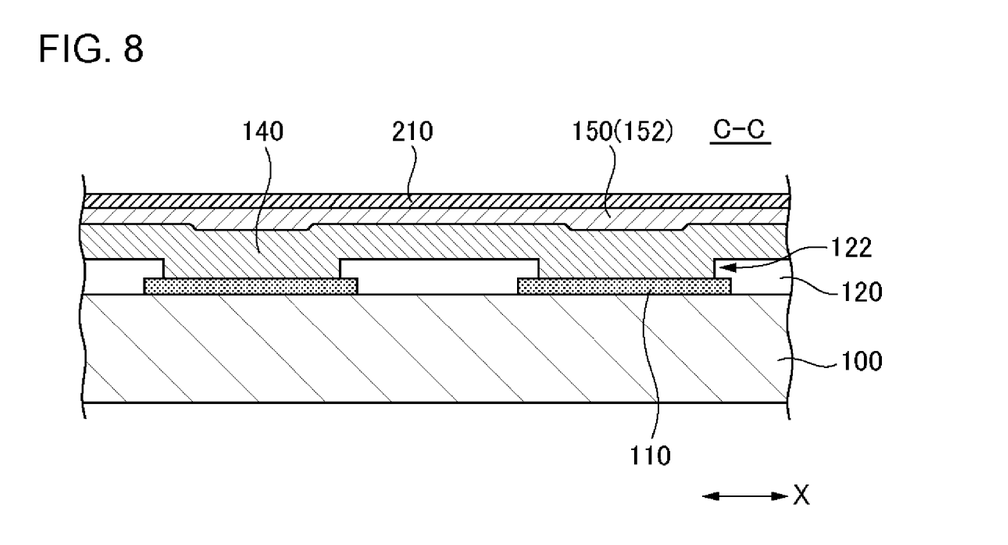
FIG. 8 is a cross-sectional view taken along line C-C of FIG. 6.
Figure 9:
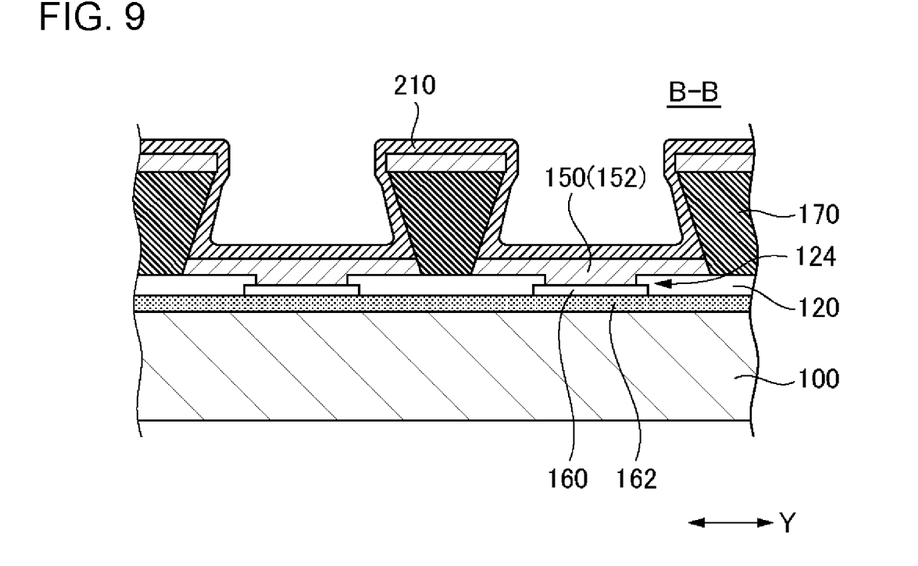
FIG. 9 is a cross-sectional view taken along line B-B of FIG. 6.

FIG. 6 is a plan view illustrating a configuration of a light-emitting device 10 included in an electrical device according to an example. FIG. 7 is a cross-sectional view taken along line A-A of FIG. 6, FIG. 8 is a cross-sectional view taken along line C-C of FIG. 6, and FIG. 9 is a cross-sectional view taken along line B-B of FIG. 6. The electrical device according to the present example includes the light-emitting device 10 and the electrical component 40. The electrical component 40 is a control IC of the light-emitting device 10, and is mounted on the substrate 100 included in the light-emitting device 10 using the anisotropic conductive film 30.

The light-emitting device 10 is, for example, a display or an illumination device. When the light-emitting device 10 is an illumination device, the light-emitting device 10 may be a device that realizes color rendering properties by including a first electrode 110, an organic layer 140, and a second electrode 150. The light-emitting device 10 as an illumination device may be configured such that the first electrode 110, the organic layer 140, and the second electrode 150 are formed to be flush with each other without forming a partition wall 170 as a structure described later. Meanwhile, in the following description, a case where the light-emitting device 10 is a display is illustrated.

The light-emitting device 10 includes a substrate 100, the first electrode 110 (lower electrode), an organic EL element, an insulating layer 120, a plurality of first openings 122, a plurality of second openings 124, a plurality of extraction interconnects 130, the organic layer 140, the second electrode 150 (upper electrode), a plurality of extraction interconnects 160, and a plurality of partition walls 170. The insulating layer 120 and the partition wall 170 are an example of a structure which is formed on the substrate. The organic EL element is constituted by a laminate with the organic layer 140 interposed between the first electrode 110 and the second electrode 150. This organic EL element is located between the plurality of partition walls 170. That is, the organic EL element and the extraction interconnect 160 are located on a first surface side of the substrate 100. A light-emitting portion is constituted by the organic EL element.

The substrate 100 is formed of, for example, glass or a resin material, but may be formed of other materials. The substrate 100 may have flexibility.

The first electrode 110 is formed on the first surface side of the substrate 100, and linearly extends in a first direction (Y direction in FIG. 3). The first electrode 110 is, for example, a transparent electrode formed of an inorganic material such as an indium thin oxide (ITO) or an indium zinc oxide (IZO), or a conductive polymer such as a polythiophene derivative. In addition, the first electrode 110 is formed as a portion of a conductor (first conductor). The first electrode 110 may be a metal thin film which is small in thickness to such an extent that light is transmitted. The end of the first electrode 110 is connected to the extraction interconnect 130. In the shown example, the first conductor is constituted by a layer having the first electrode 110 and the extraction interconnect 130 laminated therein.

The extraction interconnect 130 is an interconnect that connects the first electrode 110 to the outside including electronic parts such as a driving IC. The extraction interconnect 130 is, for example, a metal interconnect formed of a conductive oxide material such as ITO or IZO, a metal material such as Al, Cr or Ag, or an alloy thereof, but may be an interconnect formed of conductive materials other than a metal. In addition, the extraction interconnect 130 may include a laminated structure in which a plurality of layers are laminated. In this case, one layer of the extraction interconnect is constituted by the first conductor, and the first electrode 110 and one layer of the extraction interconnect 130 may be continuously formed of the first conductor. For example, the extraction interconnect 130 may have a configuration in which an alloy layer of Ni and Mo, an alloy layer of Mo and Nb, an Al layer, and an alloy layer of Ni and Mo are laminated in this order. In addition, the extraction interconnect 130 may have a configuration in which an alloy layer of Ni and Nb, an alloy layer of Al and Nd, and an alloy layer of Mo and Nb are laminated in this order.

In the example shown in FIG. 6, an extraction interconnect 132 and the extraction interconnect 130 are formed in this order on the substrate 100. The extraction interconnect 132 is formed of the same material as that of the first electrode 110. In the example shown in the drawing, the extraction interconnects 130 and 132 are formed to extend to the vicinity of a first opening 122 closest to the extraction interconnect 130. In the shown example, the first electrode 110 is covered with the insulating layer 120, but at least a portion of the extraction interconnect 130 and the extraction interconnect 132 which are electrically connected to the first electrode 110 may be covered with the insulating layer 120.

As shown in FIGS. 6 to 9, the insulating layer 120 is formed on a plurality of first electrodes 110 and in regions located therebetween. The insulating layer 120 is formed of a photosensitive resin such as a polyimide-based resin, and is formed in a desired pattern by exposure and development. As the insulating layer 120, for example, a positive-type photosensitive resin is used. Meanwhile, the insulating layer 120 may be resins other than a polyimide-based resin, for example, an epoxy-based resin or an acrylic-based resin.

The plurality of first openings 122 and the plurality of second openings 124 are formed in the insulating layer 120. The first opening 122 is located at a point of intersection between the first electrode 110 and a second conductor 152 serving as the second electrode 150 when seen in a plan view. Meanwhile, a portion of the second conductor 152 which is located within the first opening 122 serves as the second electrode 150. The plurality of first openings 122 are provided at a predetermined distance. The plurality of first openings 122 are aligned in a direction in which the first electrode 110 extends. In addition, the plurality of first openings 122 are also aligned in a direction in which the second conductor 152 extends. Thereby, the plurality of first openings 122 are disposed so as to constitute a matrix.

The second opening 124 is located at one end of each of a plurality of second conductors 152 when seen in a plan view. In addition, the second opening 124 is disposed along one side of the matrix constituted by the first openings 122. When seen in a direction along the one side (for example, Y direction in FIG. 6), the second openings 124 are disposed at a predetermined interval in a direction along the first electrode 110. The extraction interconnect 160 or a portion of the extraction interconnect 160 is exposed from the second opening 124.

Meanwhile, the insulating layer 120 having the first opening 122 and the insulating layer 120 having the second opening 124 may be formed of the same material, and may be formed of different materials. In addition, the insulating layer 120 having the second opening 124 may be formed on the outer circumferential portion side of the substrate 100 with respect to the insulating layer 120 having the first opening 122. In addition, the insulating layer 120 having the first opening 122 and the insulating layer 120 having the second opening 124 may be a continuous layer, and may be separated layers (partitioned).

The organic layer 140 is formed in a region overlapping the first opening 122. The organic layer 140 is, for example, a layer in which a hole transport layer, a light-emitting layer, and an electron transport layer are laminated. Meanwhile, in the following description, a portion of the organic layer indicates, for example, the hole transport layer, the light-emitting layer, the electron transport layer, a hole injection layer described later, or an electron injection layer. The hole transport layer comes into contact with the first electrode 110, and the electron transport layer comes into contact with the second electrode 150. In this manner, the organic layer 140 is interposed between the first electrode 110 and the second electrode 150.

Meanwhile, the hole injection layer may be formed between the first electrode 110 and the hole transport layer, and the electron injection layer may be formed between the second electrode 150 and the electron transport layer. In addition, not all of the layers mentioned above are required. For example, when the recombination of holes and electrons occurs within the electron transport layer, the electron transport layer also has a function of the light-emitting layer, and thus the light-emitting layer is not required. In addition, at least one of the first electrode 110, the hole injection layer, the hole transport layer, the electron transport layer, the electron injection layer, and the second conductor 152 serving as the second electrode second electrode 150 may be formed using a coating method such as an ink jet method. In addition, an electron injection layer formed of an inorganic material such as LiF may be provided between the organic layer 140 and the second electrode 150.

Meanwhile, in the examples shown in FIGS. 7 and 8, a case is shown in which the respective layers constituting the organic layer 140 all protrude to the outside of the first opening 122. As shown in FIG. 8, the respective layers constituting the organic layer 140 may or may not be continuously formed between the first openings 122 adjacent to each other in a direction in which the partition wall 170 extends. However, as shown in FIG. 9, the organic layer 140 is not formed in the second opening 124.

As described above, the organic layer 140 is interposed between the first electrode 110 and the second electrode 150. As shown in FIGS. 6 to 9, the second electrode 150 is formed above the organic layer 140, and extends in a second direction (X direction in FIG. 6) intersecting the first direction. The second electrode 150 is electrically connected to the organic layer 140. For example, the second electrode 150 may be formed on the organic layer 140, and may be formed on a conductive layer formed on the organic layer 140. The second conductor 152 serving as the second electrode 150 is, for example, a metal layer formed of a metal material such as Ag or Al, or a layer formed of a conductive oxide material such as IZO. The light-emitting device 10 includes a plurality of second conductors 152 parallel to each other. One second conductor 152 is formed in a direction passing over the plurality of first openings 122. In addition, the second conductor 152 is connected to the extraction interconnect 160. In the shown example, the end of the second conductor 152 is located on the second opening 124, and thus the second conductor 152 and the extraction interconnect 160 are connected to each other in the second opening 124.

In the example of FIG. 6, an extraction interconnect 162 is formed below the extraction interconnect 160. In the example shown in FIG. 6, the width of the extraction interconnect 162 is larger than the width of the extraction interconnect 160, but may be smaller than that. The extraction interconnects 160 and 162 are formed in a region of the substrate 100 on the first surface side in which the first electrode 110 and the extraction interconnects 130 and 132 are not formed. The extraction interconnect 160 may be formed, for example, simultaneously with the extraction interconnect 130, and may be formed by a process separate from that in which the extraction interconnect 130 is formed. Similarly, the extraction interconnect 162 may be formed, for example, simultaneously with the extraction interconnect 132, and may be formed by a process separate from that in which the extraction interconnect 132 is formed.

The extraction interconnect 162 is formed of the same or different material as or from a material constituting the first electrode 110. Here, an example of the same material includes an ITO having the same or different composition as or from that of an ITO constituting the first electrode 110, or a conductive oxide material such as IZO, when the first electrode 110 is formed of an ITO which is a conductive oxide material. In addition, an example of a different material includes a metal material such as Al, or the like.

A portion of a one end side (light-emitting portion side) of the extraction interconnect 160 is covered with the insulating layer 120, and is exposed by the second opening 124. In the second opening 124, the second conductor 152 is connected to the extraction interconnect 160. In addition, a portion of the other end side (outer circumferential portion side of the substrate) of the extraction interconnect 160 is extracted to the outside of the insulating layer 120. That is, the other end side of the extraction interconnect 160 is exposed from the insulating layer 120.

The partition wall 170 is formed between the second conductors 152 adjacent to each other. The partition wall 170 extends parallel to the second conductor 152, that is, in the second direction. The foundation of the partition wall 170 is, for example, the insulating layer 120. The partition wall 170 is, for example, a photosensitive resin such as a polyimide-based resin, and is formed in a desired pattern by exposure and development. The partition wall 170 is formed using, for example, a negative photosensitive resin. Meanwhile, the partition wall 170 may be formed of resins other than a polyimide-based resin, for example, an epoxy-based resin or an acrylic-based resin, or an inorganic material such as silicon dioxide.

The partition wall 170 is formed in a shape (inverted trapezoid) which is trapezoidal in cross-section and is turned upside down. That is, the width of the upper surface of the partition wall 170 is larger than the width of the lower surface of the partition wall 170. For this reason, the partition wall 170 is formed prior to the second conductor 152 (second electrode 150), and the second conductors 152 are formed to be flush on the first surface side of the substrate using a vapor deposition method or a sputtering method, thereby allowing the plurality of second electrodes 150 to be collectively formed. Since the second conductors 152 formed to be flush with each other are partitioned by the partition wall 170, the plurality of second conductors 152 are provided on the organic layer 140. A position where the second conductors 152 are partitioned includes, for example, above the insulating layer 120 which is the foundation of the partition wall 170, the lateral side of the partition wall 170, or the like. The second conductor 152 can be patterned in any shape such as a stripe shape, a dot shape, an icon shape, or a curve by changing the extending direction of the partition wall 170. Meanwhile, the second conductor 152 is formed on the partition wall 170.

In addition, when the organic layer 140 is formed of a coating material, the organic layer 140 is formed by applying the coating material to the plurality of first openings 122. When the coating material is applied to the plurality of first openings 122, the partition wall 170 may have a function of preventing the organic layer 140 from being continuously formed from the first opening 122 located on one side of the partition wall 170 to the first opening 122 located on the other side thereof, by connection of the coating material applied to the first openings 122 located on both sides of the partition wall 170. In this case, the partition wall 170 is formed prior to the organic layer 140.

The sealing film 210 is formed above the second conductor 152. The sealing film 210 is, for example, an aluminum oxide film, and is formed using, for example, an atomic layer deposition (ALD) method. In the example shown in the drawing, the sealing film 210 is formed on the second conductor 152, but another film may be present between the second conductor 152 and the sealing film 210. The thickness of the sealing film 210 is, for example, equal to or greater than 10 nm and equal to or less than 30 nm. A film formed by the ALD method has a high step coverage. Here, the step coverage refers to the uniformity of film thickness in a portion having a step. The wording "high step coverage" means that the uniformity of film thickness is also high in a portion having a step, and the wording "low step coverage" means that the uniformity of film thickness is low in a portion having a step. As shown in FIG. 6, the sealing film 210 covers the insulating layer 120, the extraction interconnect 160, and the extraction interconnect 130. Meanwhile, the sealing film 210 may be formed using a film formation method such as the ALD method, for example, a CVD method.

The extraction interconnect 130 and the extraction interconnect 160 correspond to the conductor 20 in the embodiment and Example 1. The extraction interconnect 130 and the extraction interconnect 160 are connected to the electrical component 40, for example, a control IC with the anisotropic conductive film 30 interposed therebetween. A connection structure between the electrical component 40 and the extraction interconnect 130 (or extraction interconnect 160) through the anisotropic conductive film 30 is the same as the connection structure between the electrical component 40 and the conductor 20 in the embodiment or Example 1.

Next, a method of manufacturing the light-emitting device 10 will be described. First, a conductive layer serving as the first electrode 110 is formed on the substrate 100, and this conductive layer is selectively removed using etching (for example, dry etching or wet etching) or the like. Thereby, the first electrode 110 and the extraction interconnects 132 and 162 are formed on the substrate 100.

Next, a conductive layer serving as the extraction interconnects 130 and 160 is formed on the substrate 100, the first electrode 110, and the extraction interconnects 132 and 162, and this conductive layer is selectively removed using etching (for example, dry etching or wet etching) or the like. Thereby, the extraction interconnects 130 and 160 are formed.

Next, an insulating layer is formed on the substrate 100, the first electrode 110, and the extraction interconnects 130 and 160, and this insulating layer is selectively removed using etching (for example, dry etching or wet etching) or the like. Thereby, the insulating layer 120, the first opening 122, and the second opening 124 are formed. For example, when the insulating layer 120 is formed of polyimide, heat treatment is performed on the insulating layer 120. Thereby, the imidization of the insulating layer 120 proceeds.

Next, an insulating film serving as the partition wall 170 is formed on the insulating layer 120, and this insulating film is selectively removed using etching (for example, dry etching or wet etching) or the like. Thereby, the partition wall 170 is formed. When the partition wall 170 is formed of a photosensitive insulating film, the cross-section of the partition wall 170 is formed in an inverted trapezoidal shape by adjusting conditions during exposure and development.

When the partition wall 170 is a negative resist, a portion of this negative resist which is irradiated with irradiation light from an exposure light source is cured. The partition wall 170 is formed by dissolving and removing an uncured portion of this negative resist using a developing solution.

Next, respective layers serving as the organic layer 140 are formed in order within the first opening 122. At least the hole injection layer among these layers is formed using, for example, a coating method such as spray coating, dispenser coating, ink jet, or printing. In this case, a coating material enters the first opening 122, and the respective layers are formed by this coating material being dried. As the coating material used in the coating method, a high-molecular-weight material, a material containing a low-molecular-weight material in the high-molecular-weight material, or the like is suitable. Examples of the coating materials to be used may include a polyalkylthiophene derivative, a polyaniline derivative, triphenylamine, a sol-gel film of an inorganic compound, an organic compound film containing a Lewis acid, a conductive polymer, and the like. Meanwhile, the remaining layers (for example, electron transport layer) of the organic layer 140 are formed by a vapor deposition method. However, these layers may be formed using any of the aforementioned coating methods.

Next, the second electrode 152 is formed on the organic layer 140, for example, using a vapor deposition method or a sputtering method.

Meanwhile, layers other than the organic layer 140, for example, at least one of the first electrode 110, the insulating layer 120, the extraction interconnect 130, the extraction interconnect 160, the second electrode 152, and the partition wall 170 may also be formed using any of the aforementioned coating methods.

Next, the sealing film 210 is formed using the aforementioned method. Thereafter, the electrical component 40 is mounted on the substrate 100 of the light-emitting device 10 using the method shown in the embodiment.

In the present example, for the same reason as that in the embodiment, it is also possible to easily form the opening 212 on the extraction interconnects 130 and 160, and to easily connect the extraction interconnects 130 and 160 within the opening 212 to the electrical component 40. In addition, the resin particles 34 are contained in the anisotropic conductive film 30 in addition to the metal particles 32. A variation in the diameter of the resin particles 34 is smaller than a variation in the diameter of the metal particles 32. Therefore, it is possible to more reliably connect the conductor 20 to the electrical component 40.

As described above, although the embodiment and examples have been set forthwith reference to the accompanying drawings, they are merely illustrative of the present invention, and various configurations other than those stated above can be adopted.

The invention claimed is:

1. A connection structure for an electrical component comprising:
   a substrate;
   a conductor on the substrate;
   an organic EL element on the substrate;
   a sealing film insulating and covering the conductor and the organic EL element;
   an electrical component; and
   an anisotropic conductive film having first conductive particles and second conductive particles,
   wherein the first conductive particle is harder than the second conductive particle,
   the anisotropic conductive film connects the conductor and the electrical component, and
   the first conductive particle pushes, breaks, or passes through the sealing film to contact the conductor.

2. The connection structure for an electrical component according to claim 1, wherein a portion of the first conductive particle is located within an opening of the sealing film.

3. The connection structure for an electrical component according to claim 2, wherein the anisotropic conductive film includes a first layer and a second layer which is located on the electrical component side with respect to the first layer,
  a content rate of the first conductive particles in the first layer is higher than a content rate of the second conductive particle in the second layer, and
  a content rate of the second conductive particles in the second layer is higher than a content rate of the second conductive particles in the first second layer.

4. The connection structure for an electrical component according to claim 2, wherein the anisotropic conductive film includes a surface facing the conductor and a surface facing the electrical component, and
  when a portion from the surface facing the conductor to one-third of a thickness of the anisotropic conductive film is set to a lower portion, and a portion from the surface facing the electrical component to one-third of a thickness of the anisotropic conductive film is set to an upper portion,
  a content rate of the first conductive particles in the lower portion is higher than a content rate of the first conductive particles in the upper portion, and
  a content rate of the second conductive particles in the upper portion is higher than a content rate of the second conductive particles in the lower portion.

5. The connection structure for an electrical component according to claim 3, wherein a thickness of the sealing film is smaller than a height of the first conductive particle that comes into contact with the conductor.

6. The connection structure for an electrical component according to claim 5, wherein the sealing film includes a layer formed of an oxide.

7. The connection structure for an electrical component according to claim 6, wherein a plurality of the conductors are disposed in parallel to the substrate.

8. The connection structure for an electrical component according to claim 7, wherein the conductor is connected to the organic EL element.

9. The connection structure for an electrical component according to claim 8, wherein the first conductive particle is a metal particle, and
  the second conductive particle is a resin particle having a conductive layer on a surface layer.

10. A lighting device comprising a connection structure, the connection structure comprising:
  a substrate;
  a conductor on the substrate;
  an organic EL element on the substrate;
  a sealing film insulating and covering the conductor and the organic EL element;
  an electrical component; and
  an anisotropic conductive film having first conductive particles and second conductive particles,
  wherein the first conductive particle is harder than the second conductive particle,
  the anisotropic conductive film connects the conductor and the electrical component, and
  the first conductive particle pushes, breaks, or passes through the sealing film to contact the conductor.

11. The lighting device comprising a connection structure according to claim 10, wherein a portion of the first conductive particle is located within an opening of the sealing film.

12. The lighting device comprising a connection structure according to claim 11, wherein the anisotropic conductive film includes a first layer and a second layer which is located on the electrical component side with respect to the first layer,
  a content rate of the first conductive particles in the first layer is higher than a content rate of the second conductive particle in the second layer, and
  a content rate of the second conductive particles in the second layer is higher than a content rate of the second conductive particles in the first second layer.

13. The lighting device comprising a connection structure according to claim 11, wherein the anisotropic conductive film includes a surface facing the conductor and a surface facing the electrical component, and
  when a portion from the surface facing the conductor to one-third of a thickness of the anisotropic conductive film is set to a lower portion, and a portion from the surface facing the electrical component to one-third of a thickness of the anisotropic conductive film is set to an upper portion,
  a content rate of the first conductive particles in the lower portion is higher than a content rate of the first conductive particles in the upper portion, and
  a content rate of the second conductive particles in the upper portion is higher than a content rate of the second conductive particles in the lower portion.

14. The lighting device comprising a connection structure according to claim 12, wherein a thickness of the sealing film is smaller than a height of the first conductive particle that comes into contact with the conductor.

15. The lighting device comprising a connection structure according to claim 14, wherein the sealing film includes a layer formed of an oxide.

16. The lighting device comprising a connection structure according to claim 15, wherein the sealing film comprises aluminum oxide.

17. The lighting device comprising a connection structure according to claim 16, wherein a plurality of the conductors are disposed in parallel to the substrate.

18. The lighting device comprising a connection structure according to claim 17, wherein the conductor is connected to the organic EL element.

19. The connection structure for an electrical component according to claim 18, wherein the first conductive particle is a metal particle, and
  the second conductive particle is a resin particle having a conductive layer on a surface layer.

20. The lighting device comprising a connection structure according to claim 19, wherein the thickness of the sealing film is equal to or greater than 10 nm, and equal to or less than 30 nm.

21. The lighting device comprising a connection structure according to claim 20, wherein the sealing film is formed by anatomic layer position (ALD).

* * * * *